United States Patent [19]

Lynch et al.

[11] Patent Number: 4,517,277
[45] Date of Patent: May 14, 1985

[54] PHOTOSENSITIVE RECORDING MATERIAL SUITABLE FOR THE PRODUCTION OF PRINTING PLATES AND RELIEF PLATES, AND THE PRODUCTION OF THESE PLATES USING THIS RECORDING MATERIAL

[75] Inventors: John Lynch, Monsheim; Herbert Naarmann, Wattenheim; Günther Schulz; Rudolf Vyvial, both of Ludwigshafen; Günter Wallbillich, Schifferstadt; Manfred Zürger, Sinsheim, all of Fed. Rep. of Germany

[73] Assignee: BASF Aktiengesellschaft, Fed. Rep. of Germany

[21] Appl. No.: 437,699

[22] Filed: Oct. 29, 1982

[30] Foreign Application Priority Data

Nov. 12, 1981 [DE] Fed. Rep. of Germany ....... 3144905

[51] Int. Cl.$^3$ ............................ G03C 1/68; C08F 8/02
[52] U.S. Cl. ..................................... 430/281; 430/287; 430/285; 430/909; 204/159.15
[58] Field of Search ............... 430/909, 910, 287, 288, 430/916, 281, 285; 204/159.23, 159.16, 159.15

[56] References Cited

U.S. PATENT DOCUMENTS

| 2,929,710 | 3/1960 | Martin | 96/115 |
|---|---|---|---|
| 3,427,161 | 2/1969 | Laridon et al. | 96/35.1 |
| 4,042,386 | 8/1977 | Okai et al. | 96/35.1 |
| 4,272,611 | 6/1981 | Vyvial et al. | 430/306 |
| 4,355,093 | 10/1982 | Hartmann et al. | 430/275 |

FOREIGN PATENT DOCUMENTS

| 3015419 | 10/1981 | Fed. Rep. of Germany . |
| 834337 | 5/1960 | United Kingdom . |
| 1233883 | 6/1971 | United Kingdom . |
| 1351475 | 5/1974 | United Kingdom . |

Primary Examiner—John E. Kittle
Assistant Examiner—Cynthia Hamilton
Attorney, Agent, or Firm—Keil & Weinkauf

[57] ABSTRACT

Photosensitive recording materials which are suitable for the production of printing plates and relief plates and possess a photopolymerizable relief-forming layer which can be developed with water and is based on a polyvinylalcohol/monomer mixture contain, as a binder in the said layer, a polyvinylalcohol derivative which is obtained by reacting polyvinylalcohol with an acylating agent which has groups which are polymerizable by free radicals, the reaction being carried out in the heterogeneous phase, in an aprotic dispersant, using the acylating agent in an amount which corresponds to not less than twice the molar amount required to achieve the desired degree of acylation.

5 Claims, No Drawings

PHOTOSENSITIVE RECORDING MATERIAL SUITABLE FOR THE PRODUCTION OF PRINTING PLATES AND RELIEF PLATES, AND THE PRODUCTION OF THESE PLATES USING THIS RECORDING MATERIAL

The present invention relates to a photosensitive recording material which comprises a photopolymerizable, relief forming layer R which can be developed with water and is firmly bonded to a dimensionally stable base B, in which recording material the layer R contains—in addition to a photopolymerizable, ethylenically unsaturated, low molecular weight compound, a photopolymerization initiator and, if desired, other conventional additives—a modified polyvinylalcohol possessing groups which can be polymerized by free radicals, as binder. The invention furthermore relates to a process for the production of printing plates and relief plates using this photosensitive recording material.

Photosensitive recording materials which are suitable for the production of printing plates and relief plates and are based on monomers and polymers which can be washed out with water are known per se (cf., for example, British Pat. Nos. 834,337, 1,233,883 and 1,351,475, and U.S. Pat. Nos. 4,042,386 and 4,272,611). In these publications, polyvinylalcohol is said to be employed as a polymeric binder in the photopolymerizable relief-forming layer. However, the printing plates and relief plates produced from these conventional photosensitive recording materials are not completely satisfactory in respect of their production, storage stability, reusability and water resistance. Furthermore, it has been disclosed, for example in U.S. Pat. No. 2,929,710, British Pat. No. 834,337 and German Laid-Open Application DOS No. 1,522,359, that derivatives of polyvinylalcohols which possess photopolymerizable double bonds in side chains may be employed as polymeric binders in photopolymerizable mixtures for the relief-forming layers of photosensitive recording materials. These polyvinylalcohol derivatives possessing polymerizable groups are, for example, unsaturated polyacetals or unsaturated polyesters of polyvinylalcohol. As regards the preparation of the derivatives, reference is made in the above publications to the conventional preparation methods according to which the acetalization or acylation of the polyvinylalcohol is carried out in solution. However, polyvinylalcohol derivatives prepared in this manner are relatively impure and are therefore not very suitable for use in relief-forming layers of photopolymerizable recording materials. To obtain products of high quality, the polyvinylalcohol derivatives prepared as described above have to be purified by a complicated and expensive procedure.

It is an object of the present invention to provide photosensitive recording materials which are suitable for the production of printing plates and relief plates, can be produced in a simple and reproducible manner, and can be developed with water but nevertheless are very resistant to water and moisture after exposure.

We have found that this object is achieved if the conventional photosensitive recording materials which can be developed with water contain in the photopolymerizable relief-forming layer, as polymeric binder, a polyvinylalcohol derivative which possesses groups which can be polymerized by free radicals and is obtained by reacting polyvinylalcohol with an acylating agent which has polymerizable groups, the reaction being carried out in the heterogeneous phase, in an aprotic dispersant, using acylating agent in an amount which corresponds to not less than twice the molar amount required to achieve the desired degree of acylation.

The present invention accordingly relates to a photosensitive recording material which is suitable for the production of printing plates and relief plates and comprises (a) a dimensionally stable base B and (b) a photopolymerizable, relief-forming layer R which is firmly bonded to the base, can be developed with water and consists of a mixture of (b1) a polymeric binder containing a polymerizable polyvinylalcohol derivative, (b2) one or more ethylenically unsaturated, photopolymerizable, low molecular weight compounds which are compatible with the polymeric binder, and (b3) one or more photopolymerization initiators, with or without (b4) further conventional additives and/or assistants, wherein the relief-forming layer R contains, as the polymeric binder, not less than 1% by weight, based on the total polymeric binder (b1), of a polyvinylalcohol derivative which is obtained by reacting polyvinylalcohol with an acylating agent which possesses groups which can be polymerized by free radicals, the reaction being carried out in the heterogeneous phase, in an aprotic dispersant, using the acylating agent in an amount which corresponds to not less than twice the molar amount required to achieve the desired degree of acylation.

The present invention furthermore relates to special embodiments of this photosensitive recording material, as described in detail below, and to a process for the production of printing plates or relief plates using this recording medium.

Although German Laid-Open Application DOS No. 3,015,419 discloses that similar polyvinylalcohol derivatives may be used in curable mixtures for adhesive layers of photosensitive multi-layer elements, a number of advantages, some of which are unexpected, are obtained when the above polyvinylalcohol derivatives prepared in the heterogeneous phase are used, in accordance with the invention, in the relief-forming layer R of photosensitive recording materials. Thus, in spite of the fact that the polyvinylalcohol binders are prepared batchwise in the heterogeneous phase, photosensitive recording materials which are suitable for the production of printing plates and relief plates, can be developed with water and have good properties which are readily and exactly reproducible are obtained in accordance with the invention and in a simple manner. Washing out the exposed recording materials, ie. removing the unexposed areas of the relief-forming layer with water, presents fewer problems than in the case of the conventional recording materials based on polyvinylalcohol, and in addition the resulting printing plate or relief plate has a better surface. Because they are very resistant to water, the printing plates and relief plates produced from the novel recording materials have a very long shelf life even in a moist atmosphere, and can be reused at any time.

Suitable dimensionally stable permanent bases B for the photopolymerizable relief-forming layer R of the novel recording materials are those which are conventionally used for producing printing plates and relief plates. These include, in particular, dimensionally stable plastic films, eg. polyester films, and metal bases, eg. sheets of steel or aluminum. In order to improve its adhesion to the layer R, the base B may be pretreated, in a conventional manner, mechanically, chemically and/or by providing it with a layer of adhesive.

In accordance with the invention, the layer R of the photosensitive recording material should contain, as the binder, not less than 1% by weight, based on the total binder in this layer, of the said polyvinylalcohol derivative prepared in the heterogeneous phase.

For the purposes of the invention, polyvinylalcohol is in general a polymer containing repeating $CH_2CH(OH)$ structural units in the polymer main chain, provided that this polymer is soluble or dispersible in water. In this respect, reference may also be made to the relevant cited prior art. Particularly suitable polyvinylalcohol derivatives are the conventional, partially hydrolyzed polyvinylesters, eg. polyvinylacetates or polyvinylpropionates.

In general, a polyvinylalcohol with an average degree of polymerization of from 350 to 2,500 is used for the preparation of the polyvinylalcohol derivatives employed according to the invention. The degree of hydrolysis of the polyvinylalcohol employed for the reaction is determined on the one hand by the requirement of water-solubility or water-dispersibility and on the other hand by the desired degree of conversion or of functionalization. The higher the degree of conversion with the acylating agent is to be, the higher is in general the degree of hydrolysis of the polyvinylalcohol employed for the reaction. Conventionally, the polyvinylalcohols used to prepare the polyvinylalcohol derivatives employed according to the invention have a degree of hydrolysis of from 80 to 98, in particular from 80 to 88, mole %. It is also possible to employ a mixture of polyvinylalcohols having different degrees of polymerization and/or of hydrolysis.

To prepare the polyvinylalcohol derivatives employed according to the invention, the polyvinylalcohol is reacted with an acylating agent which possesses groups which can be polymerized by free radicals. Suitable acylating agents for this reaction are the classes of compounds usually used for acylation reactions, eg. esters, acid halides and in particular carboxylic acid anhydrides. Usually, the groups which are present in the acylating agents and can be polymerized by free radicals are polymerizable ethylenic double bonds which preferably are activated, ie. are conjugated with other double bonds, or are adjacent to oxygen or nitrogen atoms. Examples of particularly advantageous acylating agents, therefore, are those derived from acrylic acid or methacrylic acid, and of these, acrylic anhydride and methacrylic anhydride should be singled out.

In accordance with the invention, the reaction of the polyvinylalcohol with the acylating agent is carried out in the heterogeneous phase, by suspending the polyvinylalcohol in an aprotic dispersant and then reacting it, in this suspension, with the acylating agent, the mixture being mixed vigorously at the same time. Particularly suitable aprotic dispersants are lower halohydrocarbons, lower aliphatic ketones and aromatic and/or aliphatic hydrocarbon solvents. Methylene chloride or acetone is preferably used as a dispersant for the reaction. It has proved advantageous to use from 30 to 75, in particular from 40 to 65, % by weight of the aprotic dispersant in the polyvinylalcohol suspension. To obtain polyvinylalcohol derivatives which are suitable for use, in accordance with the invention, in the photosensitive recording materials, it was found to be necessary to react the acylating agent with the polyvinylalcohol using the former in an amount which corresponds to not less than twice the molar amount required to achieve the desired degree of acylation. It has been found that the properties of the product are more advantageous, the greater the excess of acylating agent used. The upper limit of the amount of acylating agent employed is determined only by economic considerations, and about a five-fold molar excess of acylating agent has been found in general to be a useful upper limit.

The degree of acylation of the polyvinylalcohol is determined not only by the concentration of the acylating agent, but in particular by the particle size of the polyvinylalcohol employed, the reaction temperature and the reaction time. Polyvinylalcohols having particle sizes of from 1 to 5,000 $\mu$m have proved suitable for the reaction with the acylating agent in the heterogeneous phase, but those having a mean particle size of about 50–500 $\mu$m are preferred. The reaction temperature for the acylation may be, for example, above the boiling point of the aprotic dispersant, but is in general from 0° to 100° C., preferably from 40° to 60° C. The reaction time depends on the desired degree of acylation, and is usually from 1 to 80, in particular from 20 to 40, hours.

For use, in accordance with the invention, in the relief-forming layer R of the photosensitive recording material, the polyvinylalcohol is reacted with the acylating agent in the heterogeneous phase until the polyvinylalcohol derivative obtained contains from 1 to 30, in particular from 2 to 25, % by weight, based on the polyvinylalcohol derivative, of acyl groups which can be polymerized by free radicals.

The polymeric binder (b1) in the photopolymerizable relief-forming layer R of the photosensitive recording material can consist completely or only partially of the polyvinylalcohol derivative possessing polymerizable acyl groups, but should contain no less than 1% by weight of this derivative. Recording materials which are particularly suitable for the production of printing plates and relief plates are those in which the polymeric binder (b1) in layer R contains from 10 to 40% by weight of the polyvinylalcohol derivative possessing polymerizable acyl groups, and from 90 to 60% by weight of other polymeric binders, the percentages being based on the total polymeric binder (b1). These other polymeric binders must likewise be capable of being washed out with water, ie. must be water-soluble or water-dispersible, and should be substantially compatible with the said polyvinylalcohol derivative. In this context, substantially compatible means that the components give a homogeneous mixture which can be employed in photosensitive recording materials. Examples of other polymeric binders of this type are nonmodified polyvinylalcohols as such; other polyvinylalcohol derivatives, eg. oxyethylated polyvinylalcohol, such as that described in, for example, U.S. Pat. No. 4,272,611 and used in photopolymerizable mixtures; polyvinylpyrrolidone and N-vinylpyrrolidone copolymers, eg. N-vinylpyrrolidone/vinyl acetate copolymers; cellulose derivatives, starch and/or starch derivatives; acrylic acid copolymers; and polyvinylcinnamates.

Suitable photopolymerizable, ethylenically unsaturated low molecular weight compounds (b2) are conventional monomers and/or oligomers which have molecular weights of no more than 5,000, preferably of no more than 3,000, are usually used for photosensitive recording materials of the type under discussion, and are described in, for example, the literature cited at the outset. The photopolymerizable low molecular weight compounds can contain one or more ethylenically unsaturated double bond; preferably, some or all, preferably about 1–40% by weight, of these compounds contain more than one ethylenically unsaturated double bond. Since the polymeric binder in the layer R of the novel photosensitive recording material likewise contains photopolymerizable groups, it is also possible for the layer R exclusively to contain photopolymerizable low molecular weight compounds having only one ethylenic double bond, provided that the proportion, in the binder component (b1), of the polyvinylalcohol derivative possessing polymerizable acyl groups, and-/or the degree of acylation of this derivative, are adjusted accordingly. The choice of the type and amount of the photopolymerizable, ethylenically unsaturated low molecular compounds is determined on the one hand by the intended end use of the photosensitive recording materials, eg. the desired hardness of the relief plates produced therefrom, and on the other hand by the compatibility of the monomer with the polymeric binders employed in the photopolymerizable relief-forming layer R, and the requirement that this layer should be capable of being washed out with water, ie. should be soluble or dispersible therein. Usually, the photopolymerizable ethylenically unsaturated low molecular weight compounds boil at above 100° C. under atmospheric pressure.

Examples of preferred photopolymerizable ethylenically unsaturated low molecular weight compounds are those possessing hydroxyl groups, amide groups and polyethyleneglycol structural units. Very suitable compounds are mono- and polyacrylates, and/or the corresponding methacrylates, of monohydric and polyhydric low molecular weight alcohols, eg. hydroxylalkyl acrylates and hydroxyalkyl methacrylates, where alkyl is of 1 to 8 carbon atoms in each case, such as β-hydroxyethyl acrylate, β-hydroxypropyl acrylate, β-hydroxyethyl methacrylate, ethylene glycol diacrylate, methylene glycol dimethacrylate, monoacrylates, diacrylates, monomethacrylates and dimethacrylates of polyethylene glycols or polypropylene glycols with molecular weights of no more than about 500, butane-1,4-diol diacrylate, butane-1,4-diol dimethacrylate, 1,1,1-trimethylolpropane triacrylate, 1,1,1-trimethylolpropane trimethacrylate, and glycerol diacrylate, triacrylate, dimethacrylate or trimethacrylate. Other suitable compounds are low molecular weight prepolymeric urethane acrylates such as are obtained, for example, by reacting hydroxyalkyl acrylates or hydroxyalkyl methacrylates (eg. β-hydroxyethyl acrylate, β-hydroxyethyl methacrylate, β-hydroxypropyl acrylates or β-hydroxypropyl methacrylate), organic diisocyanates (eg. hexamethylene diisocyanate, toluylene diisocyanate or isophorone diisocyanate) and, if desired, low molecular weight aliphatic diols as chain extenders.

The amounts of polymeric binder (b1) and the photopolymerizable ethylenically unsaturated low molecular weight compounds (b2) in the photopolymerizable relief-forming layer R can be varied within a wide range, namely in general about 10–90, preferably 40–70, % by weight of (b1) and 90–10, preferably 30–60, % by weight of (b2), the percentages being based on the sum of (b1) and (b2) in each case.

The photopolymerizable relief-forming layer R also contains conventional amounts of from 0.001 to 10, preferably from 0.1 to 5, % by weight, based on the sum of all constituents of the layer, of one or more photopolymerization initiators which should be compatible with the constituents of this layer, and dispersible in the layer to the extent required to initiate the desired polymerization or crosslinking on exposure to actinic radiation. Examples of photopolymerization initiators, which may be employed individually or as mixtures with one another, are acyloins and their derivatives, such as benzoin, benzoin alkyl ethers, eg. benzoin methyl ether and benzoin isopropyl ether, α-methylolbenzoin and its ethers eg. α-methylolbenzoin methyl ether, and α-methylbenzoin and α-methylbenzoin ethyl ether, vicinal diketones and their derivatives, such as benzil, benzil ketals, eg. benzil dimethyl ketal, benzil methyl ethyl ketal, benzil methyl benzyl ketal and benzil ethylene glycol ketal, unsubstituted or substituted multinuclear quinones, eg. 9,10-anthraquinone and benzanthraquinone, and in particular acylphosphine oxides of the type described in, for example, German Laid-Open Application DOS No. 2,909,992 and DOS No. 3,114,341, and used in photopolymerizable mixtures. Examples of preferred initiators from the class comprising the acylophosphine oxides are 2,6-dimethoxybenzoyldiphenylphosphine oxide, ethyl 2,4,6-trimethylolbenzoylphenylphosphinate and sodium 2,4,6-trimethylbenzoylphenylphosphinate. The photopolymerization initiators can also be used in conjunction with other co-initiators and/or activators such as are described in sufficient detail in the relevant literature.

In many cases, it is advantageous if the polymerizable relief-forming layer R contains, in addition to the said constituents, usual amounts of other conventional additives and/or assistants. These include, in particular, thermal polymerization inhibitors, eg. hydroquinone, hydroquinone derivatives, nitrophenols and salts of N-nitrosocyclohexylhydroxylamine, dyes and/or pigments, extenders, plasticizers, fillers, etc. By appropriate choice of the type and amount of the additives and-/or assistants, the properties of the photopolymerizable relief-forming layer R, or of the printing plates or relief plates produced therefrom, can be adapted to suit the particular special end use and requirements. The additives and/or assistants are employed in conventional amounts, but these should not exceed 50, preferably about 30, % by weight, based on all constituents of the layer R.

The photopolymerizable relief-forming layer R can be applied directly to the base B; however, depending on the materials employed, it may be advantageous or necessary to anchor the layer R firmly to the base B by means of an adhesive layer which is in general about 0.5–40 μm thick. Commercially available one-component or two-component adhesives can be used for the adhesive layer, the type of adhesive employed depending on the base material and on the material of the relief-forming layer R applied thereto. The adhesive layers described in German Laid-Open Application DOS No. 3,015,419 for use in photosensitive recording materials of the type under discussion have proved particularly advantageous.

It may likewise be advantageous also to apply an upper layer U of the layer R, the upper layer U usually being about 0.1–10 μm thick. Such upper layers U, which are also washed away during the development of the exposed recording material and should therefore be soluble in water, advantageously consist of a polyvinylalcohol having a degree of hydrolysis of no less than 95 mole % and a viscosity of from 2 to 8 mPas (measured as a 4% strength by weight aqueous solution at 20° C.). The production of photosensitive recording materials which are of the type under discussion and have polyvinylalcohol upper layers is described in, for example, German Laid-Open Application DOS No. 3,128,950. It is also possible to apply a strippable cover sheet to the upper layer U or the layer R, this sheet being removed either before exposure or before washout.

The novel photosensitive recording materials are produced in a conventional manner. For example, the photopolymerizable relief-forming layer R can be produced on the base B by casting from a solution of a mixture of the constituents of this layer. It is also possible to produce a layer of this type by compression-molding, extruding or calendering, and then to bond it to the base B in a suitable manner. The layer R of the novel photosensitive recording material is in general from 10 μm to 7 mm, in particular from 300 μm to 1 mm, thick. As regards further details concerning the production of photosensitive recording materials, reference may be made to the prior art known to the skilled worker, for example to the patents cited at the beginning hereof.

The novel photosensitive recording materials are particularly suitable for the production of printing plates and relief plates by imagewise exposure of the photopolymerizable relief-forming layer R and subsequent removal, in particular washout, of the unexposed, non-crosslinked areas of the layer with water in a conventional manner. Exposure can be carried out in a flat-plate exposure unit or a rotary or cylindrical exposure unit, using conventional sources of actinic light, eg. UV fluorescent tubes, low-pressure, medium-pressure and high-pressure mercury vapor lamps, superactinic fluorescent tubes, pulsed xenon lamps, lamps doped with metal halide, carbon-arc lamps, etc. The wavelength emitted should be in general from 230 to 450 nm, preferably from 300 to 420 nm, and should be matched to the individual absorption of the photoinitiator present in the layer R. Because the exposed, photocrosslinked relief layer has a greatly improved, high resistance to water, the novel recording materials react less critically to washout conditions than conventional plates of the type under discussion, ie. the washout time can be extended and the washout conditions can be made harsher, without the printing plates or relief plates produced therefrom being adversely affected; on the contrary, the above measures produce sharper relief images. After washout, the resulting printing plates or relief plates are dried in the usual manner, if necessary at a temperature as high as 120° C. In some cases, it is advantageous to after-expose the resulting printing plates or relief plates to actinic light over their entire surface in order to increase their strength.

The printing plates and relief plates produced using the novel photosensitive recording materials possess extremely high resistance to water, and are therefore particularly advantageous for all end uses where this property is important. For example, the novel photosensitive recording materials can be particularly advantageously used to produce pattern plates and printing plates. Relief plates of this type have long shelf lives and can be reused many times, even in a warm, moist atmosphere. Furthermore, they possess a particularly smooth surface.

The Examples which follow illustrate the invention. Parts and percentages are by weight, unless stated otherwise. Parts by volume bear the same relation to parts by weight as the liter to the kilogram. The molecular weights of the polyvinylalcohols were determined from the viscosities, the latter being measured on 4% strength by weight aqueous solutions at 20° C., using a Höppler viscometer.

EXAMPLE 1

1.1: 40 parts of a partially hydrolyzed polyvinylacetate having a degree of hydrolysis of 80 mole % and a mean molecular weight of 60,000 were suspended in 60 parts of acetone, and 10 parts of methacrylic anhydride were added. The non-homogeneous mixture was stirred for about 40 hours at 60° C., after which the product was filtered off under suction. The resulting polyvinylalcohol derivative contained 2.5% of bonded methacrylol groups.

1.2: A solution was produced from 50 parts of water, 10 parts of the polyvinylalcohol/methacrylic anhydride reaction product prepared as described in 1.1, 40 parts of a partially hydrolyzed polyvinylacetate having a degree of hydrolysis of 80 mole % and a mean molecular weight of 30,000, 40 parts of β-hydroxyethyl methacrylate, 6.0 parts of tetraethylene glycol dimethacrylate, 1.5 parts of benzil dimethyl ketal and 0.2 part of 2,6-di-tert.-butyl-p-cresol. This solution was used to produce a layer R of about 2 mm thickness on a steel sheet (base B) provided with a polyurethane adhesive, and the layer was then dried.

1.3: The recording material produced as described in 1.2 was processed to give a relief printing plate in a conventional manner, by exposing the layer R imagewise to actinic light, washing out the non-exposed areas of this layer with water, drying the resulting printing plate and then after-exposing it. The printing plates obtained faithfully reproduced all details in the negative and gave excellent printed copies even after storage for several weeks at 25° C. and a relative humidity of 80%.

COMPARATIVE EXPERIMENT A

The procedure described in Example 1 was followed, except that the recording material was produced using, instead of the polyvinylalcohol derivative prepared as described in 1.1 in heterogeneous phase, 10 parts of a polyvinylalcohol derivative prepared as follows.

20 parts of a partially hydrolyzed polyvinylacetate having a degree of hydrolysis of 80 mole % and a mean molecular weight of 30,000 were dissolved in 80 parts of dimethylsulfoxide, and 5 parts of methacrylic anhydride were added. After a reaction time of 10 hours at 60° C., the product was precipitated by pouring the reaction solution into methylene chloride, and was filtered off.

The polyvinylalcohol derivative obtained in this manner gave recording materials having unsatisfactory exposure properties. In particular, fine image sections were poorly structured, and negative image sections were too shallow.

EXAMPLE 2

2.1: 50 parts of a partially hydrolyzed polyvinylacetate having a degree of hydrolysis of 88 mole % and a mean molecular weight of 30,000 were suspended in 40 parts of methylene chloride, and 60 parts of methacrylic anhydride were then added. The non-homogenous reaction mixture was stirred for 20 hours at 60° C., after which the product was isolated and dried. The resulting polyvinylalcohol derivative contained 15% of bonded methacryloyl groups.

2.2: A solution was prepared from 50 parts of water, 20 parts of the polyvinylalcohol derivative prepared as described in 2.1, 15 parts of a partially hydrolyzed polyvinylacetate having a degree of hydrolysis of 80 mole % and a mean molecular weight of 30,000, 15 parts of another partially hydrolyzed polyvinylacetate having a degree of hydrolysis of 88 mole % and a mean molecular weight of 25,000, 35 parts of β-hydroxyethyl methacrylate, 8 parts of butane-1,4-diol dimethacrylate, 1.5 parts of benzil dimethyl ketal, 0.15 part of 2,6-di-tert.-butyl-p-cresol and 0.05 part of N-nitrosocyclohexylhydroxylamine, and, a photosensitive recording material was produced as described in Example 1.2 using this solution.

2.3: This recording material was exposed imagewise to actinic light, the non-exposed areas of layer R were washed out with water and the material was dried to give a relief plate which had an extremely high resistance to water, and could be very advantageously used as a pattern plate.

COMPARATIVE EXPERIMENT B

The procedure described in Example 2 was followed, except that, instead of the polyvinylalcohol derivative prepared as described in 2.1, a further 20 parts of a partially hydrolyzed polyvinylacetate having a degree of hydrolysis of 80 mole % and a mean molecular weight of 30,000 were employed. A relief plate produced by a procedure similar to that described in Example 2.3 had a more readily deformable relief image. The unfavorable mechanical properties, which made the plate unsuitable for use as a pattern plate, deteriorated further when the plate was stored in a moist atmosphere.

EXAMPLE 3

3.1: 20 parts of a partially hydrolyzed polyvinylacetate having a degree of hydrolysis of 88 mole % and a mean molecular weight of 60,000 were suspended in 30 parts of acetone, and 10 parts of methacrylic anhydride were added. The non-homogenous reaction mixture was stirred for about 40 hours at 60° C., after which a polyvinylalcohol derivative was isolated. This derivative contained 10% of bonded methacryloyl groups.

3.2: A solution was prepared from 50 parts of water, 50 parts of the polyvinylalcohol derivative prepared as described in 3.1, 40 parts of β-hydroxyethyl methacrylate, 4 parts of trimethylolpropane triacrylate, 1.5 parts of benzil dimethyl ketal and 0.5 part of 2,6-di-tert.butyl-p-cresol. A layer of this solution was cast onto a polyester film coated with an adhesive, and the layer was then dried.

3.3: The photosensitive recording material obtained in this manner was exposed to actinic light over its entire surface and thereafter cut into pieces measuring 2 cm×2 cm. These pieces were extracted with water for about 2 hours at 90° C., after which the weight loss was 8%. After extraction, the exposed samples were still completely intact and usable.

3.4: The photosensitive recording material produced as described in 3.2 was exposed imagewise to actinic light, developed with water and dried. The printing plate obtained had a sharp relief image, even in the case of fine lines, and a long shelf life, and could be reused many times.

COMPARATIVE EXPERIMENT C

The procedure described in Example 3 was followed, except that, instead of the polyvinylalcohol/methacrylic anhydride reaction product, unreacted, partially hydrolyzed polyvinylacetate having a degree of hydrolysis of 88 mole % and a mean molecular weight of 60,000 was employed. After extraction with water, the samples produced and exposed as described in Example 3 showed a weight loss of 50% and signs of extensive attack, and were no longer usable. The printing plate obtained on imagewise exposure possessed substantially poorer performance characteristics.

We claim:

1. A photosensitive recording material which is suitable for the production of printing plates and relief plates and comprises
    (a) a dimensionally stable base B and
    (b) a photopolymerizable, relief-forming layer R having a thickness of from 300 μm to 7 mm which is firmly bonded to the base,
can be developed with water and consists of a mixture of
    (b1) a polymeric binder containing a polymerizable polyvinylalcohol derivative,
    (b2) at least one ethylenically unsaturated, photopolymerizable, low molecular weight compound which is compatible with the polymeric binder, and
    (b3) at least one photopolymerization initiator, with or without
    (b4) further conventional additives and/or assistants, wherein the photopolymerizable relief-forming layer R contains, as the polymeric binder, not less than 1% by weight, based on the total polymeric binder (b1), of a polyvinylalcohol derivative which is obtained by reacting polyvinylalcohol with an acylating agent which possesses groups which can be polymerized by free radicals, the reaction being carried out in the heterogeneous phase, in an aprotic dispersant, using the acylating agent in an amount which corresponds to not less than twice the molar amount required to achieve the desired degree of acylation.

2. The photosensitive recording material of claim 1, wherein the polyvinylalcohol derivative present as the polymeric binder in the photopolymerizable relief-forming layer R contains from 1 to 30% by weight, based on the polyvinylalcohol derivative, of acyl groups which can be polymerized by free radicals.

3. The photosensitive recording material of claim 1, wherein the polyvinylalcohol derivative present as the polymeric binder in the photopolymerizable relief-forming layer R is obtained by reacting polyvinylalcohol with acrylic anhydride and/or methacrylic anhydride as the acylating agent.

4. The photosensitive recording material of claim 1, wherein the photopolymerizable relief-forming layer R contains, as the polymeric binder (b1), from 10 to 40% by weight, based on the total polymeric binder (b1), of the polyvinylalcohol derivative possessing acyl groups which can be polymerized by free radicals, and from 90 to 60% by weight, based on the total polymeric binder (b1), of further water-soluble or water-dispersible polymeric binders which are substantially compatible with the polyvinylalcohol derivative.

5. The photosensitive recording material of claim 1, wherein the layer R is from 300 μm to 1 mm in thickness.

* * * * *

UNITED STATES PATENT AND TRADEMARK OFFICE
CERTIFICATE OF CORRECTION

PATENT NO. : 4,517,277
DATED : May 14, 1985
INVENTOR(S) : John LYNCH et al.

It is certified that error appears in the above-identified patent and that said Letters Patent is hereby corrected as shown below:

On the title page;

Please correct the name of one of the inventors.

Change:
Manfred Zürger to Manfred Zuerger

Signed and Sealed this

Twenty-second Day of October 1985

[SEAL]

Attest:

DONALD J. QUIGG

Attesting Officer

Commissioner of Patents and
Trademarks—Designate